US012631957B2

(12) United States Patent
Oviedo Robles et al.

(10) Patent No.:  US 12,631,957 B2
(45) Date of Patent:  May 19, 2026

(54) REPAIR METHOD FOR PHOTOMASK DEFECTS

(71) Applicant: Intel Corporation, Santa Clara, CA (US)

(72) Inventors: Juan Pablo Oviedo Robles, Santa Clara, CA (US); Raja Katta, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 889 days.

(21) Appl. No.: 17/897,270

(22) Filed: Aug. 29, 2022

(65) Prior Publication Data

US 2024/0069433 A1     Feb. 29, 2024

(51) Int. Cl.
*G03F 1/74*     (2012.01)
*G03F 1/84*     (2012.01)

(52) U.S. Cl.
CPC . *G03F 1/74* (2013.01); *G03F 1/84* (2013.01)

(58) Field of Classification Search
CPC ................. G03F 1/74; G03F 1/84; G03F 1/72
See application file for complete search history.

(56) References Cited

U.S. PATENT DOCUMENTS

2004/0071888 A1*   4/2004   Chondroudis ....... G01N 1/2813
                                                        506/37
2007/0285728 A1*  12/2007   Horie ........................ G03F 1/84
                                                        358/1.9

2014/0255831 A1*   9/2014   Hofmann .................. G03F 1/72
                                                        118/721
2019/0348619 A1*  11/2019   Fenoll .................... H10K 85/40

OTHER PUBLICATIONS

Esfandiarpour, Samaneh, Lindsay Boehme, and J. Todd Hastings. "Focused electron beam induced deposition of copper with high resolution and purity from aqueous solutions." Nanotechnology 28.12 (2017): 125301. (Year: 2017).*
Bresin, M. et al., "Liquid Phase Electron-Beam-Induced Deposition on Bulk Substrates Using Environmental Scanning Electron Microscopy", Microscopy and Microanalysis, 2014, pp. 376-384, vol. 20, Issue 2, Microscopy Society of America.
Fisher, J. S. et al., "Rapid Electron Beam Writing of Topologically Complex 3D Nanostructures Using Liquid Phase Precursor", Nano Letters, Nov. 12, 2015, pp. 8385-8391, vol. 15, American Chemical Society.

(Continued)

*Primary Examiner* — Jayson D Cosgrove
(74) *Attorney, Agent, or Firm* — Viering, Jentschura & Partner mbB

(57)     ABSTRACT

The present disclosure is directed to a repair method including providing a scanning electron microscope (SEM) with an electron beam directed at a defective multilayer photomask disposed in the SEM; disposing a droplet of a liquid precursor on a surface of the defective multilayer photomask with a defect; pointing a gas flow on the droplet, wherein the gas flow is configured to planarize the droplet; and repairing the defect in the defective multilayer photomask by performing a chemical reaction on the planarized droplet. A photomask repair system and a photomask repair tool is also provided.

20 Claims, 12 Drawing Sheets

100

101 — providing a scanning electron microscope (SEM) with an electron beam directed at a defective multilayer photomask disposed in the SEM 102 — disposing a droplet of a liquid precursor on a surface of the defective multilayer photomask with a defect 103 — pointing a gas flow on the droplet, wherein the gas flow is configured to planarize the droplet 104 — repairing the defect in the defected multilayer photomask by performing a chemical reaction on the planarized droplet

(56) References Cited

OTHER PUBLICATIONS

Randolph, S. J. et al., "Capsule-Free Fluid Delivery and Beam-Induced Electrodeposition in a Scanning Electron Microscope", RSC Advances, Aug. 14, 2013, pp. 20016-20023, vol. 3, Royal Society of Chemistry.

Esfandiarpour, S. et al., "Limiting Regimes for Electron-Beam Induced Deposition of Copper from Aqueous Solutions Containing Surfactants", Nanotechnology, Apr. 9, 2021, 19 pages, vol. 32, Lexington, US.

Esfandiarpour, S. et al., "Focused Electron Beam Induced Deposition of Copper with High Resolution and Purity from Aqueous Solutions", Nanotechnology, Feb. 21, 2017, 15 pages, vol. 28, IOP Publishing.

Lami, S. K. et al., "The Radiation Chemistry of Focused Electron-Beam Induced Etching of Copper in Liquids", Nanoscale, May 9, 2019, 14 pages, Issue 24, Royal Society of Chemistry.

Lami, S. K. et al., "Nanoscale focused electron beam induced etching of nickel using a liquid reactant", Nanotechnology, Jul. 22, 2020, 11 pages, vol. 31, IOP Publishing.

Boehme, L. et al., "Focused electron beam induced etching of copper in sulfuric acid solutions", Nanotechnology, Nov. 16, 2015, 11 pages, vol. 26, IOP Publishing.

Donev, E. U. et al., "Nanoscale Deposition and Etching of Materials Using Focused Electron Beams and Liquid Reactants", Liquid Cell Electron Microscopy, 2016, pp. 291-315, Cambridge University Press.

Olsson, E. et al., "A conservative level set method for two phase flow", Journal of Computational Physics, Nov. 20, 2005, pp. 225-246, vol. 210, Issue 1, Elsevier.

* cited by examiner

200

REPAIR METHOD FOR PHOTOMASK DEFECTS

BACKGROUND

In the manufacture of integrated circuits (IC), or chips, patterns representing different layers of the chips are created on a series of reusable photomasks (also referred to herein as masks) in order to transfer the design of each chip layer onto a semiconductor substrate during the manufacturing process. The masks are used much like photographic negatives to transfer the circuit patterns for each chip layer onto the semiconductor substrate. These chip layers are built up using a sequence of processes and translate into the tiny transistors and electrical circuits that include each completed chip. Thus, any defects in the mask may be transferred to the chip and potentially adversely affect its performance. A major source of defects may be attributed to defective photomasks. Defects that are severe enough may render a mask completely useless. However, photomasks are expensive to produce and it is preferable to repair a defective photomask when possible rather than to dispose of it.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
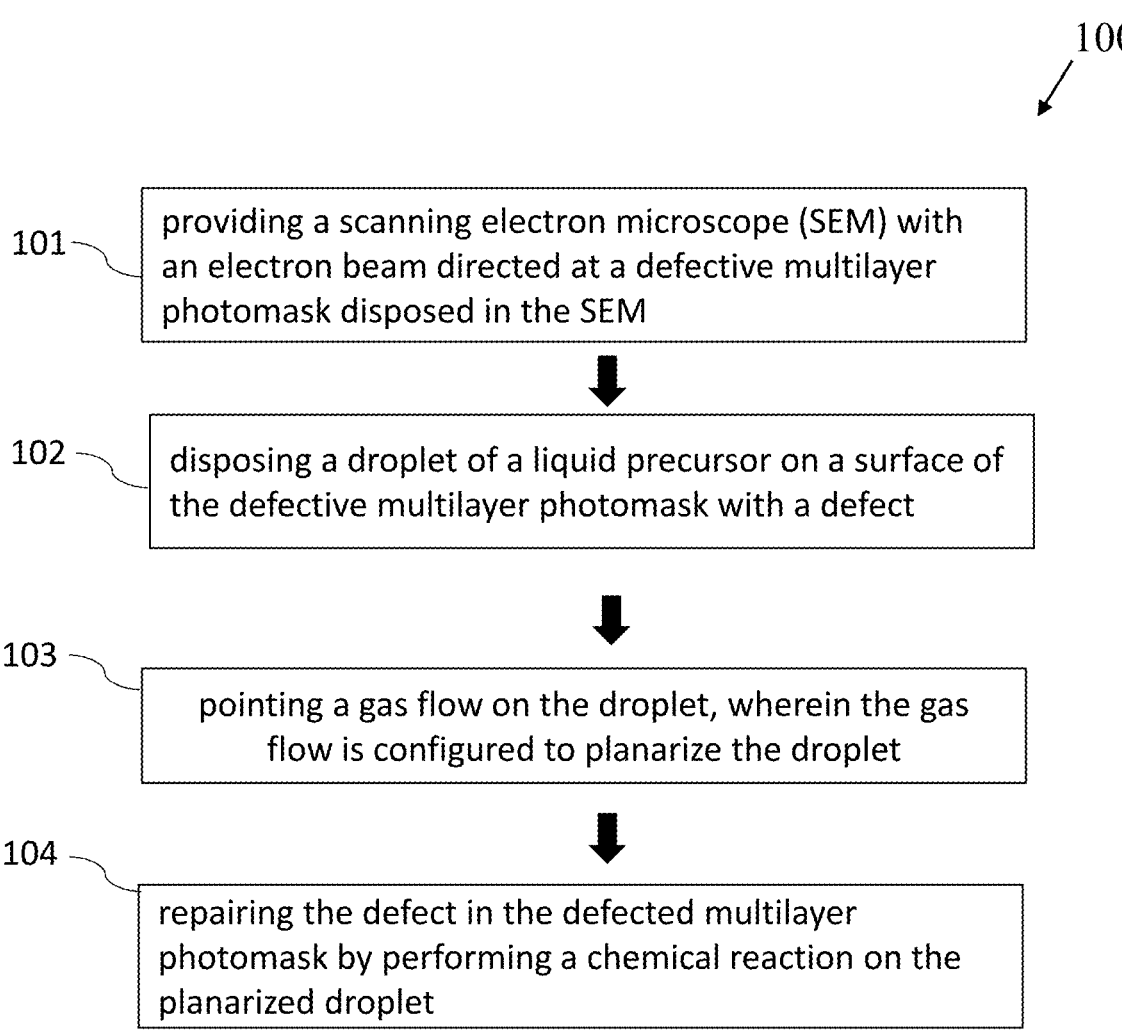
FIG. 1 schematically shows a simplified flow diagram for an exemplary repair method according to an aspect of the present disclosure.

In the semiconductor industry, a photolithography process refers to a process in which a pattern is delineated in a layer of material (e.g., photoresist) sensitive to photons, electrons or ions. The principle is similar to that of a photo-camera in which an object is imaged on a photo-sensitive emulsion film. While with a photo-camera the "final product" is the printed image, the image in the semiconductor process context typically is an intermediate pattern which defines regions where a material is deposited or removed.

A typical photolithography system includes a light source, optical system and a transparent photomask, or a reflective photomask. The light source emits light through the optical system and photomask onto a photoresist layer of a semiconductor wafer. The photomask defines the "intermediate pattern" used for determining where photoresist is to be removed or left in place.

The photomask serves to define geometries for materials deposited or etched on the wafer or materials applied to the wafer. The patterned film on the photomask includes mask lines and line spacings of less than 10 micrometers (μm). Depending on the reduction factor x, line width and line space geometries for a resulting semiconductor device may range from less than 10 μm to less than 2 μm, or less than 25 nanometers (nm). When working with such small geometries, it is important that the photomask is free of any defect. A defect on the photomask may alter the desired pattern to be imaged onto the wafer, which may drastically reduce the yield of the process.

One previous attempt for solving this problem involved repairing a defective photomask by using electrons reacting with gas precursors for molecular dissociation-based etching or deposition of material at specific locations of the photomask. Alternatively, liquid precursors (such as aqueous solutions of metal salts or acids and bases) could be used for repairing the photomask. This is known as Liquid Phase Electron Beam Induced Processing or LPEBIP. The advantage of using a liquid precursor is that the liquid precursors allow much faster processing times, as well as a wider range of materials to etch and deposit (based on current knowledge of electrochemistry and radiation chemistry), and provide a high selectivity at material interfaces.

Such repair methods may be carried out in a scanning electron microscope (SEM). The SEM is typically a tool used in the semiconductor industry for inspection of semiconductor features, such as via holes and lines. It operates by bombarding a semiconductor surface with an electron beam. The electrons reflect into a detector. The surface geometry and materials affect the amount of electrons reflected, and hence the amount of reflected electrons can be used to derive an image of the feature.

While the SEM is a useful tool for inspection, it is also capable of effecting chemical reactions, e.g., when a liquid precursor is bombarded with the electrons emitted by the electron beam. Thus, in a repair mode, by carrying out a chemical reaction, material is deposited from a liquid precursor which, in turn, may be able to repair a defect in the defective photomask.

One condition for using liquid precursors for electron beam processing in the SEM is the ability to create thin films of the liquid precursor at the precise location where the repair on the photomask is needed. Previous approaches to do so included, e.g., hydrating microchannels with water vapor, or by controlling the pressure inside an environmental scanning electron microscope (ESEM), as well as directly injecting the liquid precursor through a capillary by means of a liquid injection system (LIS). Though the later approach may successfully add a liquid precursor at a desired location, it may create a droplet having a diameter of about 20 μm to 50 μm, which has a 3D profile that includes a thick liquid center and a thin liquid edge. However, carrying out a repair method in the SEM requires a high resolution. Since this high resolution could only be found at the thinnest region of the droplet, e.g., at its edge, previous attempts for repairing the photomask using LPEBIP in the SEM were limited by the thickness of the droplet, and thereby limited to the position of the edge of the droplet. This is not optimal for photomask defect repair, since only small and imprecise regions at the edge of the droplet would be created for high resolution pattern repairs or edits, rendering this approach not optimal for photomask repair.

To address the above insufficiency, the present disclosure provides a repair method 100, as illustrated in the flow diagram of FIG. 1. In an operation 101, the repair method 100 includes providing a scanning electron microscope (SEM) with an electron beam directed at a defective multilayer photomask disposed in the SEM. In an operation 102, the repair method 100 includes disposing a droplet of a liquid precursor on a surface of the defective multilayer photomask with a defect. In an operation 103, the repair method 100 includes pointing a gas flow on the droplet, wherein the gas flow is configured to planarize the droplet. In an operation 104, the repair method 100 includes repairing the defect in the defective multilayer photomask by performing a chemical reaction on the planarized droplet.

The repair method 100 may be carried in the SEM, which may be used for effecting the chemical reaction, as well as for inspecting a reaction product from the chemical reaction.

In aspects of the present application, the SEM parameters are configured such that it operates in a repair mode instead of an inspection/measuring mode. The SEM parameters that are changed may include landing energy settings and exposure times. When in repair mode, the SEM can effect a chemical reaction by using an electron beam directed at the defect in the photomask.

The SEM may include a vacuum chamber in which the repair method 100 may be carried out. Such a vacuum chamber may be operated at a pressure that is below 1 atm (101.325 kPa).

Advantageously, a gas flow is used in the method 100 for planarizing a droplet of a liquid precursor solution. This gas flow may cause the droplet to be planarized, e.g., flattened, such that a thickness of the droplet is reduced from its previous thickness. The reduced thickness enables the repair method to be carried out in a higher resolution, which may improve the precision of the repair method 100. In other words, due to the higher resolution resulting from the planarized droplet, it is possible to position the electron beam inside the SEM more precisely, thereby enabling an improved repair of the defective multilayer photomask. The repair method 100 may also enable the repair of larger defects, since it may be carried out on a larger area. For example, it may be possible to repair defects on an area spanning as large as 10 µm.

In some aspects, the repair method 100 may be carried out in an ESEM. The ESEM may allow for the presence of a gas in the vacuum chamber, which enables for the repair method 100 to be carried out at a higher pressure than the pressure typically employed in a SEM which is about $10^{-3}$ to $10^{-4}$ Pa. Accordingly, by using an ESEM, it is possible to carry out the repair method 100 at a pressure range between 400 Pascal and 800 Pascal. Such pressure range may advantageously result in less evaporation of a liquid of the liquid precursor, thereby facilitating the repair method 100 to be carried out. A further advantage of the ESEM is the possibility to operate on non-conductive samples without any preparation.

The gas that may be present in the vacuum chamber may include an inert gas, such as argon, nitrogen, helium, etc. The inert gas may be moisturized. For example, in some aspects, the inert gas may be moisturized to a vapor pressure of approximately 700 Pascal to about 900 Pascal, or about 800 Pascal. Advantageously, such vapor pressures may prevent or hinder evaporation of the liquid in the liquid precursor.

In another aspect of the repair method 100, the temperature at which the repair method is carried out may range approximately between 1° C. and 15° C., or between 3° C. and 10° C. In some aspects, the temperature that may be applied may be referred to as that corresponding to a Peltier cooled stage. Advantageously, at such a temperature range, less evaporation of the liquid precursor is effected, thereby facilitating the repair method 100 to be carried out.

With reference to FIGS. 2A, 2B, 2C and 2D, the repair method 200 may include providing a SEM 210, optionally with a vacuum chamber (not shown), and placing a defective photomask 220 into the SEM 210.

Figure 2A:
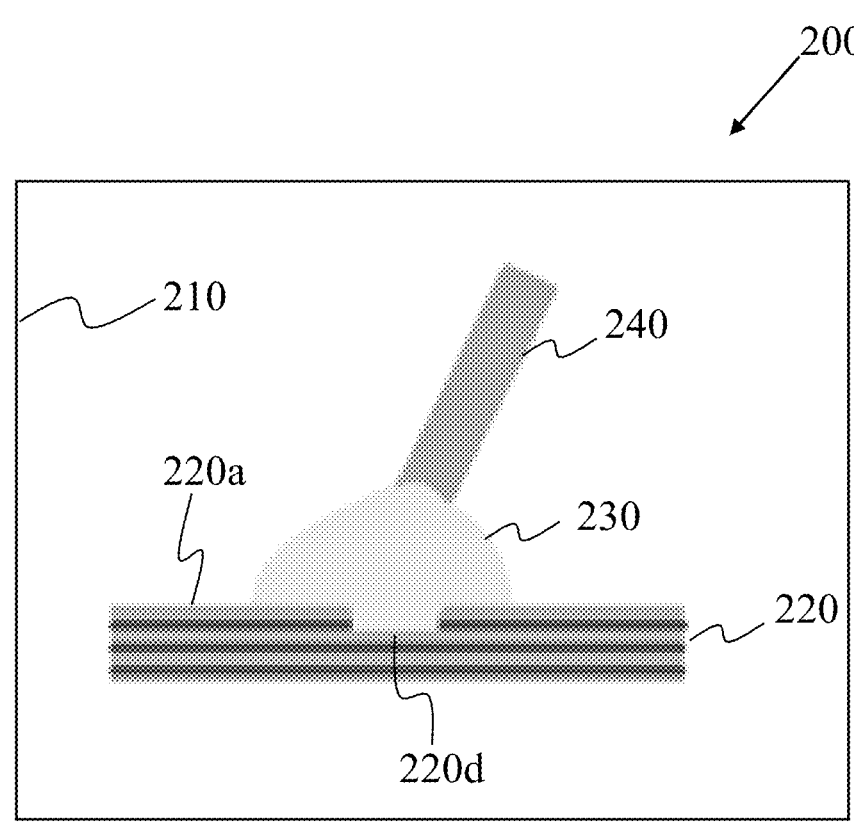
FIG. 2A to FIG. 2D illustrate a repair method in accordance with an aspect of the disclosure.

As illustrated in FIG. 2A, the defective multilayer photomask 220 may include a defect 220d, which may typically involve an undesired element trapped between the layers and/or distorted layers between the layers of the defective multilayer photomask 220. Accordingly, in an initial step, the method 200 may involve an etching step to remove the undesired element and/or the distorted layers, resulting in a missing layer in the defective multilayer photomask 220, shown as at least one missing layer in the defective multilayer photomask 220 in FIG. 2A. A droplet 230 of a liquid precursor may be disposed on a surface of the defective photomask 220a with the defect 220d, such that the droplet 230 covers the defect 220d. In some aspects, the deposition of the droplet 230 is carried out by using first a liquid injection system (LIS) 240. The LIS 240 may include a glass capillary (not shown) configured to deposit the droplet 230. The droplet 230 may have a contact angle on the surface of the defective photomask 220a of about 30° to about 80°, or about 45° to about 70°. The contact angle of the droplet 230 may be influenced by the nature of the surface of the defective photomask 220a (e.g., the material of the surface layer on which the droplet 230 is disposed) and/or surfactants and/or UV/ozone and/or oxygen plasma treatment of the surface 220a.

Figure 2B:
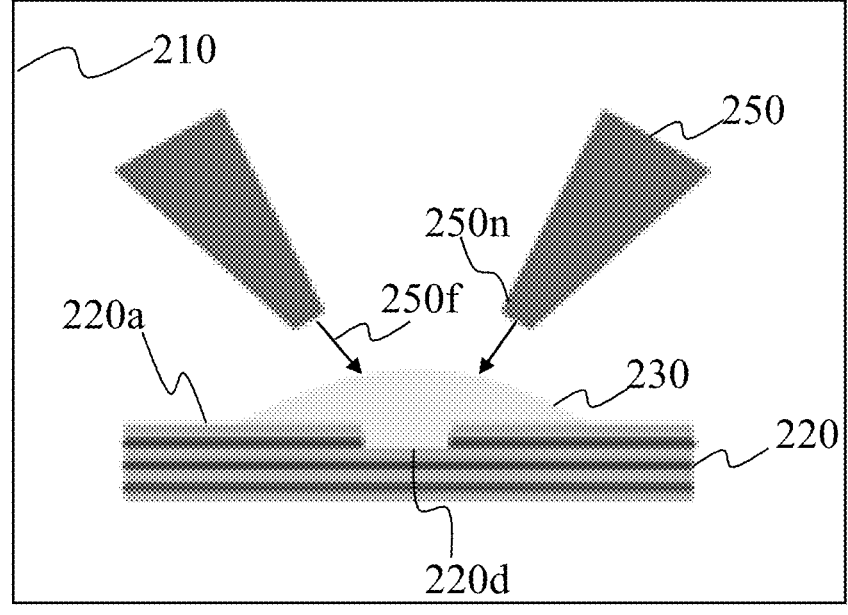

Subsequently, as illustrated in FIG. 2B, a gas flow 250f may be pointed on the droplet 230. The gas flow 250f may be provided by a gas injection system (GIS) 250. The GIS 250 may include at least one gas nozzle 250n pointed at the droplet 230. The gas nozzle 250n may be positioned to the droplet 230 in a distance ranging approximately from 200 µm to 400 µm, or approximately from 250 µm to 350 µm. Such a gas flow 250f may be configured to planarize the droplet 230, e.g., by applying a pressure on the surface of the droplet 230, wherein the pressure may be higher than the surface tension, thereby forcing the droplet 230 to flatten out. Accordingly, a droplet 230 which may have a thickness of 1 µm to about 10 µm before the gas flow 250f is pointed on the droplet 230, may be planarized, or flattened, to a thickness of below 1 µm. Such planarization may advantageously effect that the resolution of the SEM may be higher, and thus, the repair method 200 may be carried out with higher precision.

The gas flow 250f may be provided by more than one gas nozzle 250n, such as two gas nozzles 250n. Two gas nozzles 250n may provide two gas flows 250f, from two different directions. The two directions may be controlled such that the droplet 230, when being planarized, flattens out into a desired direction. For example, during the planarization, the area that is covered by the droplet 230 may be enlarged. By controlling the directions of the two gas flows, it is thus possible to expand the area that the planarized droplet 230 covers. Advantageously, more gas nozzles (e.g., 2, 3 or 4 gas nozzles) may provide a more even planarization of the droplet 230.

Figure 2C:
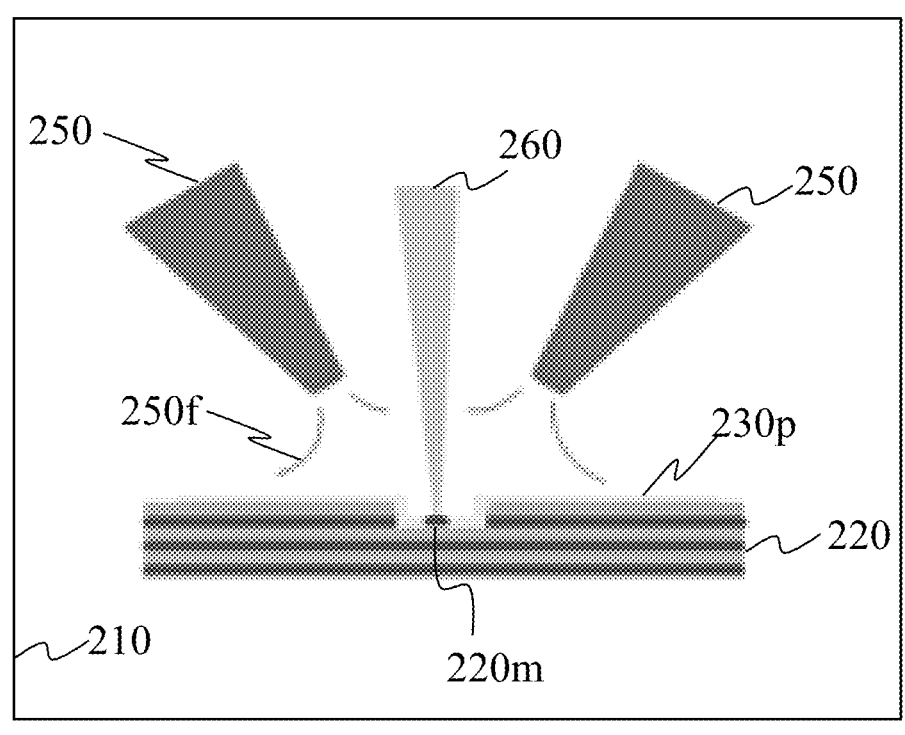

As illustrated in FIG. 2C, the SEM 210 may include an electron beam 260 directed at the defect 220*d* of the defective multilayer photomask 220. Subsequent to the planarization, a chemical reaction may be carried out that may repair the defect 220*d* in the defective multilayer photomask 220. The chemical reaction may involve a deposition or an etching. In a deposition step, the electron beam 260 may facilitate an electrochemical reaction for deposition of material from liquid precursor 230*p*. In such a deposition, low energy electrons emitted by the electron beam 260 may activate reactants in the liquid precursor 230*p* to form active species on the surface of the defective multilayer photomask 220, which may be subsequently reacted into deposited material 220*m*, as indicated in FIG. 2C. The liquid precursor 230*p* may, in these aspects, include an ionic precursor of the material that is configured to be disposed. Accordingly, for the deposition, the liquid precursor 230*p* may include a precursor with aqueous solutions of metal salts, such as $CrCl_3$ to deposit Chromium, $CuSO_4:H_2SO_4$ to obtain Cu, $H_2PtCl_6$ to obtain Pt, $HAuCl_4$ to obtain Au, $AgNO_3$ for Ag deposition, $SiCl_4$ to obtain Si, or combinations thereof. In an etching step, the liquid precursor 230*p* may include an etching solution, such as acids or bases. The acids may include sulfuric acid, which may etch copper and nickel selectively. The bases may include potassium hydroxide which may etch silicon nitride. In some aspects, the LIS 240 may include more than one capillary for the deposition of different liquid precursors.

Figure 2D:
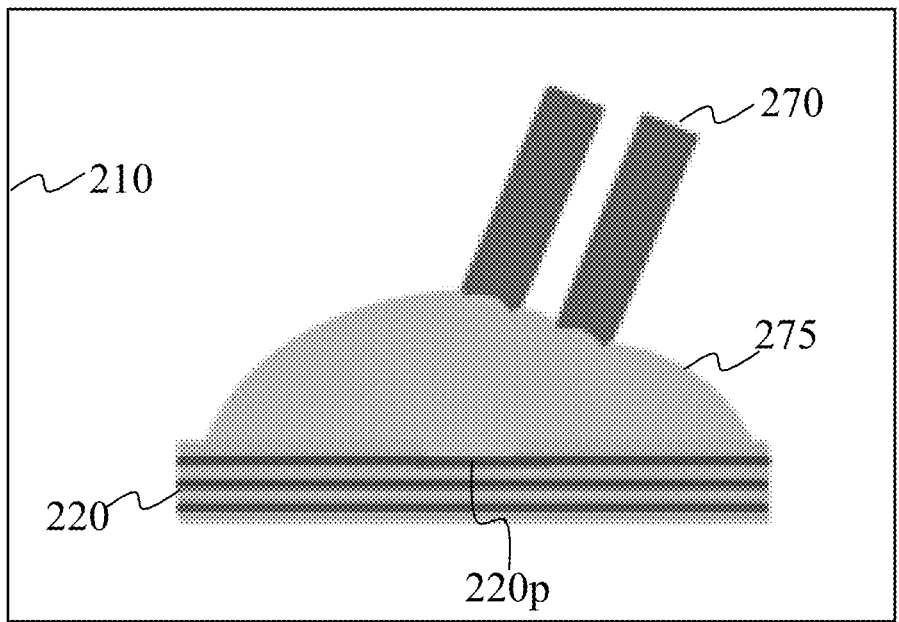

Subsequent to the chemical reaction, as illustrated in FIG. 2D, the remaining part of the liquid precursor may be removed. The remaining parts may include unreacted precursor or a byproduct of the chemical reaction. For the removal, in some aspects, a second liquid injection system (LIS) 270 may be used. The LIS 270 may advantageously be positioned into proximity of where the droplet 230 was placed. This LIS 270 may advantageously include more than one capillary, wherein one capillary may be used for flowing a rinsing agent 275 over the repaired area, while the other capillary may be used for suction, to remove the rinsing agent 275 together with the remaining part of the liquid precursor. An alternative method to remove the remaining part of the liquid precursor may involve an in situ spincoating method, which may rinse substantially the entire area of the multilayer photomask 220. After the rinsing, the rinsing agent 275 may be removed by changing the temperature of the multilayer photomask 220 and the pressure in the chamber of the SEM 210. The rinsing agent 275, after the spincoating, may also be removed by evaporation with the GIS 250.

After the remaining part of the liquid precursor is removed, an inspection may be carried out to assess the repair. As shown in FIG. 2D, by carrying out the chemical reaction, at least one layer was added to the defective multilayer photomask 220 as the reaction product 220*p*. If an additional chemical reaction may be required, the repair method 200 may be repeated, i.e. another droplet 230 of a liquid precursor may be disposed on the surface 220*a* of the defective multilayer photomask 220; another gas flow 250*f* may be pointed on the droplet 230, causing the droplet 230 to be planarized, and another chemical reaction may be performed to repair the defect 220*d* in the defective multilayer photomask 220.

According to some aspects, the above stated inspection may be carried out while the pressure in the vacuum chamber is retained at a pressure range between 400 Pascal and 800 Pascal. This may have the benefit that it may not be required to vent the chamber between two chemical reactions, which may enhance the capability, throughput and range of materials that may be used for the repair of the defective photomask 220 and improve operational efficiency.

Figure 3:
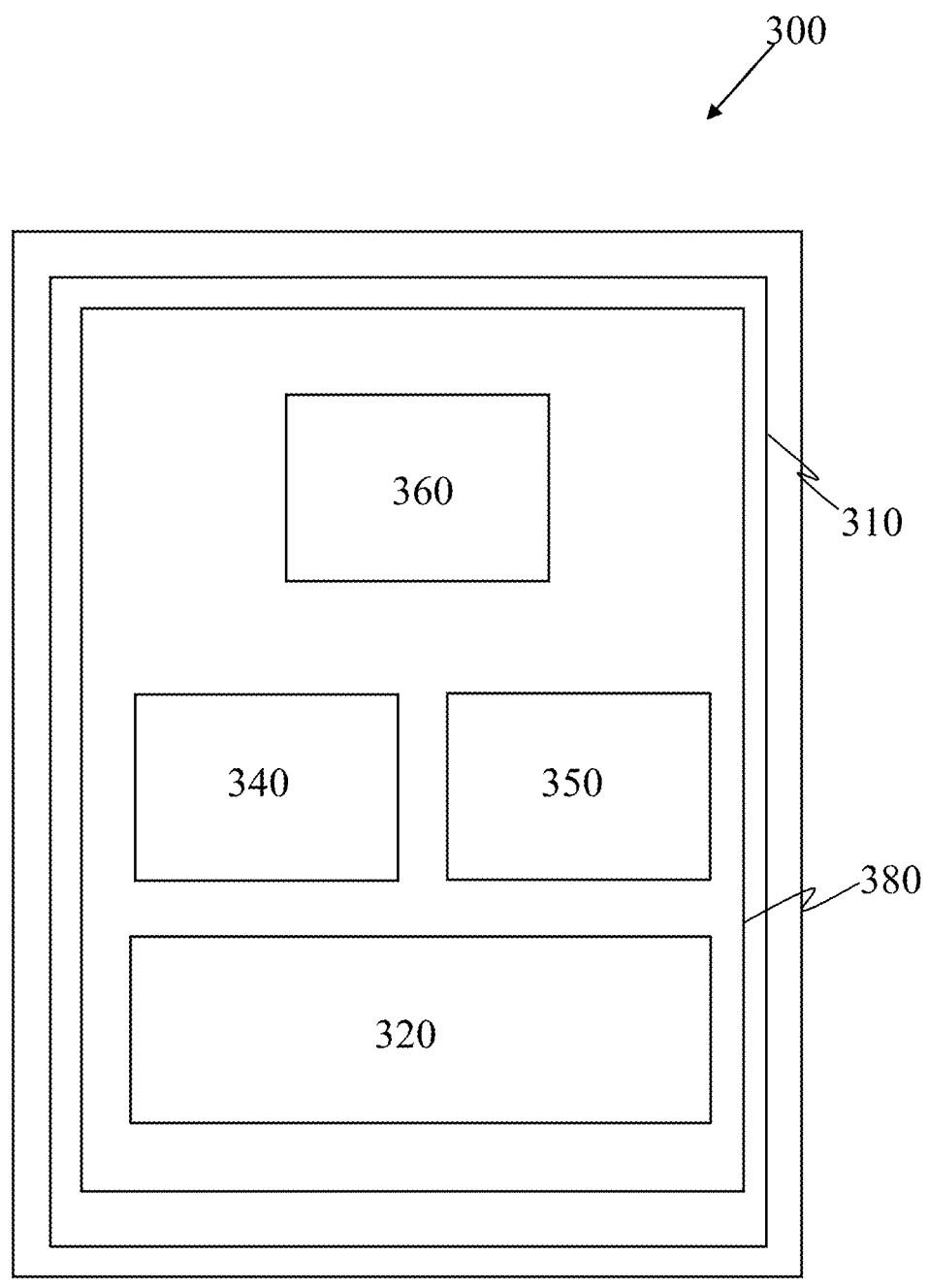
FIG. 3 schematically shows a photomask repair system according to the present disclosure.

With reference to FIG. 3, a photomask repair system 300 may be provided. The photomask repair system 300 may include a scanning electron microscope (SEM) 310. The photomask repair system 300 may include a liquid injection system (LIS) 340 positioned to deposit a droplet of a liquid precursor on a defective multilayer photomask 320. The photomask repair system 300 may include a gas injection system (GIS) 350 positioned to point a gas flow on the droplet, wherein the gas flow is configured to planarize the droplet. The photomask repair system 300 may include an electron beam 360 configured to perform an electron-beam-induced electrochemical reaction on the planarized droplet.

In one aspect, the photomask repair system 300 may include a vacuum chamber 380 configured to operate at a pressure in the range of approximately 400 Pascal and 800 Pascal. Moreover, the SEM 310 may include an ESEM.

Aspects and advantages described for repair methods 100 and 200 can be analogously valid for the photomask repair system 300, and vice versa. As the various aspects and advantages have already been described above, they shall not be iterated for brevity where possible.

Figure 4:
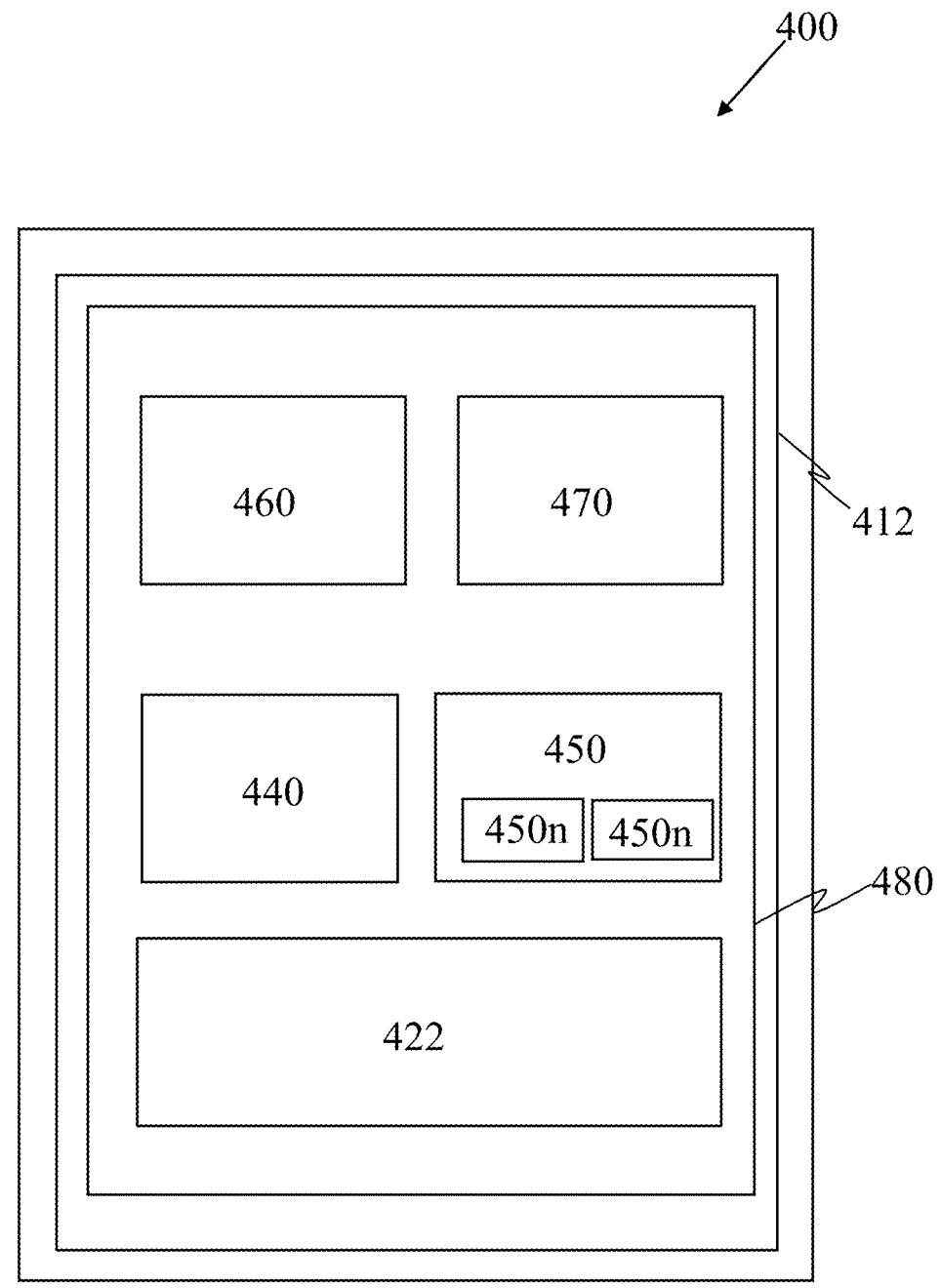
FIG. 4 schematically shows a photomask repair tool according to the present disclosure.

With reference to FIG. 4, a photomask repair tool 400 is provided. The photomask repair tool 400 may include an environmental scanning electron microscope (ESEM) 412 including a vacuum chamber 480 and an electron beam 460. The photomask repair tool 400 may include a first liquid injection system 440 configured to deposit a droplet of a liquid precursor (not shown) on a defect on an extreme ultraviolet (EUV) photomask 422. The photomask repair tool 400 may include a GIS 450 that may be configured to eject a gas flow on the EUV photomask 422 within the vacuum chamber 480. The GIS 450 may be positioned in a distance of approximately from 200 μm to 400 μm from the EUV photomask 412.

In one aspect, the photomask repair tool the GIS 450 of the photomask repair tool 400 may include at least one gas nozzle 450*n*. In particular, the GIS may include two gas nozzles 450*n* configured to eject two gas flows from two directions on the droplet.

In one aspect, the photomask repair tool 400 may include a second liquid ejection system 470 configured to rinse the liquid precursor from the EUV photomask 420.

Aspects and advantages described for repair methods 100 and 200 as well as the photomask repair system 300 can be analogously valid for the photomask repair tool 400, and vice versa. As the various aspects and advantages have already been described above, they shall not be iterated for brevity where possible.

In the following a model is described to assess the viability of the planarization of the droplet using finite element simulation. The following parts describe this model and its results in detail.

Simulation of Gas-Planarization of a Droplet

A finite element simulation was conducted through Comsol (6.0) software showing the effect that a vertical pulse of nitrogen gas has on a water droplet of different sizes (R=40 μm and 20 μm) placed on top of a surface with different contact angles (90°, 60°, and 45°). The simulation was carried out as 2D axisymmetric, time dependent. To solve this problem, it is necessary to solve the Navier-Stokes equations, which describe the fluid motion, as well as to track the interface between the nitrogen gas and the water, for which the Level-Set method is used.

Methods

The Laminar Two-Phase Flow, Level Set interface in Comsol uses a reinitialized, conservative level set method to describe and convect the fluid interface, given that the fluid flow is incompressible and laminar. The 0.5 contour of the level set function Φ defines the interface, where Φ equals 0 in nitrogen gas and 1 in water. In a transition layer close to the interface, Φ goes smoothly from 0 to 1. The interface moves with the fluid velocity u. The following equation describes the convection of the reinitialized level set function:

$$\frac{\partial \phi}{\partial t} + u \cdot \nabla \phi + \gamma \left[ \left( \nabla \cdot \left( \phi(1-\phi) \frac{\nabla \phi}{|\nabla \phi|} \right) \right) - \varepsilon \nabla \cdot \nabla \phi \right] = 0$$

The thickness of the transition layer is proportional to ε. For this model, $\varepsilon = h_c/2$, where $h_c$ is the mesh size in the region occupied by the droplet. The parameter γ determines the amount of reinitialization. This value was chosen as the maximum magnitude occurring in the velocity field.

In addition to defining the fluid interface, the level set function is used to smooth the density and viscosity jumps across the interface through the definitions:

$$\rho = \rho_{air} + (\rho_{ink} - \rho_{air})\phi$$

$$\mu = \mu_{air} + (\mu_{ink} - \mu_{air})\phi$$

In order to simulate transport of mass and momentum, the incompressible Navier-Stokes equations, including surface tension, were used. Both water and nitrogen gas can be considered incompressible, as long as the fluid velocity is small relative to the speed of sound. The Navier-Stokes equations are:

$$\rho \left( \frac{\partial u}{\partial t} + u \cdot \nabla u \right) - \nabla \cdot \left( \mu(\nabla u + \nabla u^T) \right) + \nabla p = F_{st}$$

$$(\nabla \cdot u) = 0$$

Here, ρ denotes density (kg/m³), μ equals the dynamic viscosity (N·s/m²), u represents the velocity (m/s), p denotes pressure (Pa), and $F_{st}$ is the surface tension force. The surface tension force is computed as $$F_{st} = \sigma \delta \kappa n$$

where n is the interface normal, σ is the surface tension coefficient (N/m), $\kappa = -\nabla \cdot n$ is the curvature, and δ equals a Dirac delta function that is nonzero only at the fluid interface. The normal to the interface is $$n = \frac{\nabla \phi}{|\nabla \phi|}$$

while the delta function is approximated by $$\delta = \vartheta |\phi(1-\phi)| |\nabla \phi|.$$

At t=0 the water droplet is modeled as a quarter of a circle of radius R=40 or 20 μm, surrounded by nitrogen, while being above a substrate. Above the water droplet there is the geometry of a constriction in the gas flow with an inlet at the top, where Φ=0 is used as the inlet boundary condition for the level set variable, to simulate the effect of a gas nozzle on the gas flow. Also, an outlet was defined in the surrounding borders to represent open space. The magnitude of the pressure at the outlet did not matter because the velocity depends only on the pressure gradient. All other boundaries, except the substrate, were set to No slip conditions, and the Wetted wall condition was set on the substrate, with a contact angle of 90°, 60°, and 45° and a slip length of 10 μm (typical of simulations at this scale). The slip length is defined as an extrapolated distance relative to the wall where the tangential velocity component of the fluid vanishes. The following are the parameters used for the geometry of the model:

NozzleInletR=0.1 [mm] "Nozzle inlet radius"
NozzleL=0.375 [mm] "Nozzle length"
NozzleR=0.025 [mm] "Nozzle radius"
ThroatL=0.025 [mm] "Throat length"
SubstrateL=0.3 [mm] "Distance to substrate"
NitrogenW=0.15 [mm] "Nitrogen gas channel width"

The materials were chosen from the materials library as nitrogen and water. The temperature was selected as T=276.15 K or 3° C., which is the temperature typically used in LPEBIP experiments inside an ESEM, to avoid the evaporation of the liquid precursor.

Figure 5:
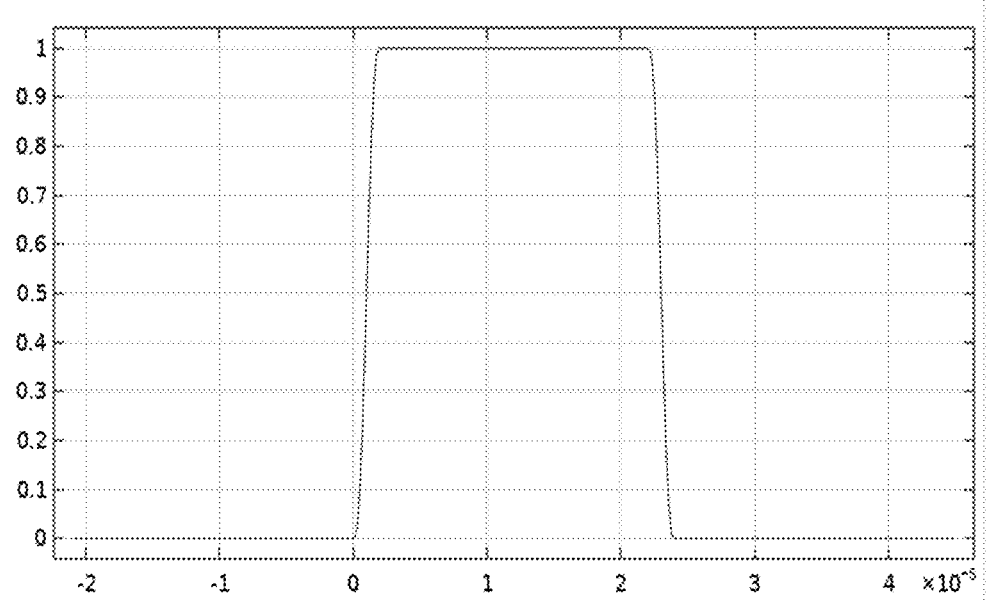
FIG. 5 shows a smooth rectangular pulse function.

As the simulation starts, the mean inlet velocity in the z direction increases from 0 to 5 meters per second (m/s) during the first 2 microseconds (μs). The velocity is then maintained for 20 μs and finally decreases to 0 for another 2 μs. The time-dependent mean velocity in the z direction can then be defined as $$v\_in = 5 \text{ [m/s]} * rect1(t[1/s]) \text{ "Inlet velocity"}$$

where t is given in seconds and rect(t) is a smooth rectangular pulse function with the transition points at 1 μs and 23 μs with a 2 μs transition period (see, FIG. 5).

Results and Discussion

Figure 6:
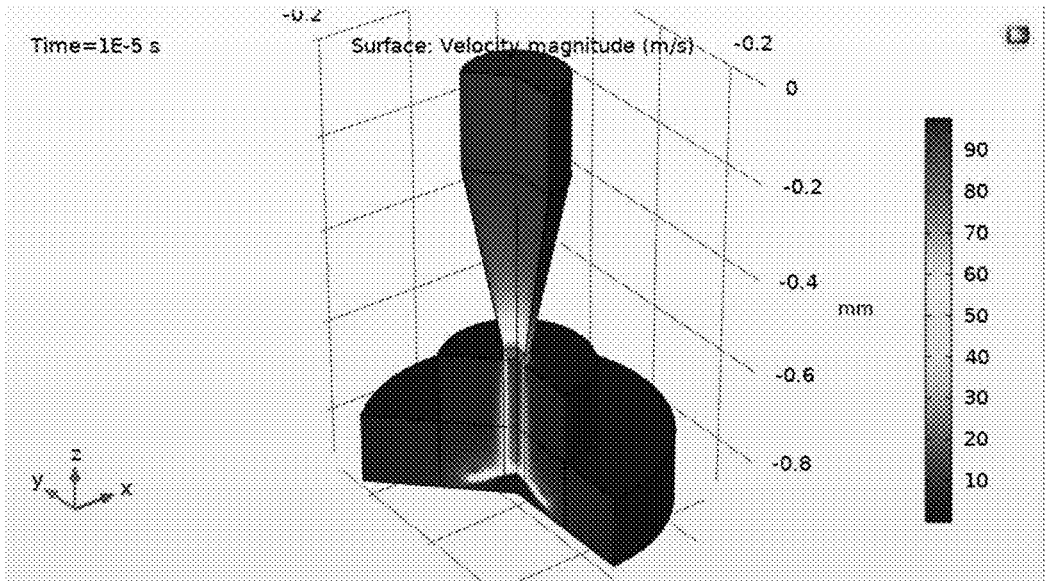
FIG. 6 shows the fluid velocity as the nitrogen gas exits the nozzle.

The Knudsen number for this system, also known as the ratio of the molecular mean free path length to a representative physical length scale, helps determine whether statistical mechanics or continuum mechanics of fluid dynamics should be used to model a problem. It is defined as $K_n = \lambda/L$. In the case of the gas planarization model, it was assumed that the gas surrounding the substrate is nitrogen (particle diameter of 364 picometres (pm)) at 3° C., at a pressure of 5.5 Torr. This gives λ=8.833 μm. When considering the distance between the gas nozzle and the substrate (L=300 μm), this gives a $K_n$=0.0294, which is just in the threshold between continuum flow and slip flow. However, because the gas pressure coming from the nozzle is much higher than the ambient pressure, this problem can be treated as a continuum flow fluid dynamics system. The speed of the gas flow at the inlet (5 m/s) was chosen, as this provided an adequate uniform stream of gas to planarize the droplet without blowing it away, while still carrying a significant flattening effect (see, FIG. 6). Smaller gas flows did not seem to alter the droplet significantly.

Figure 7:
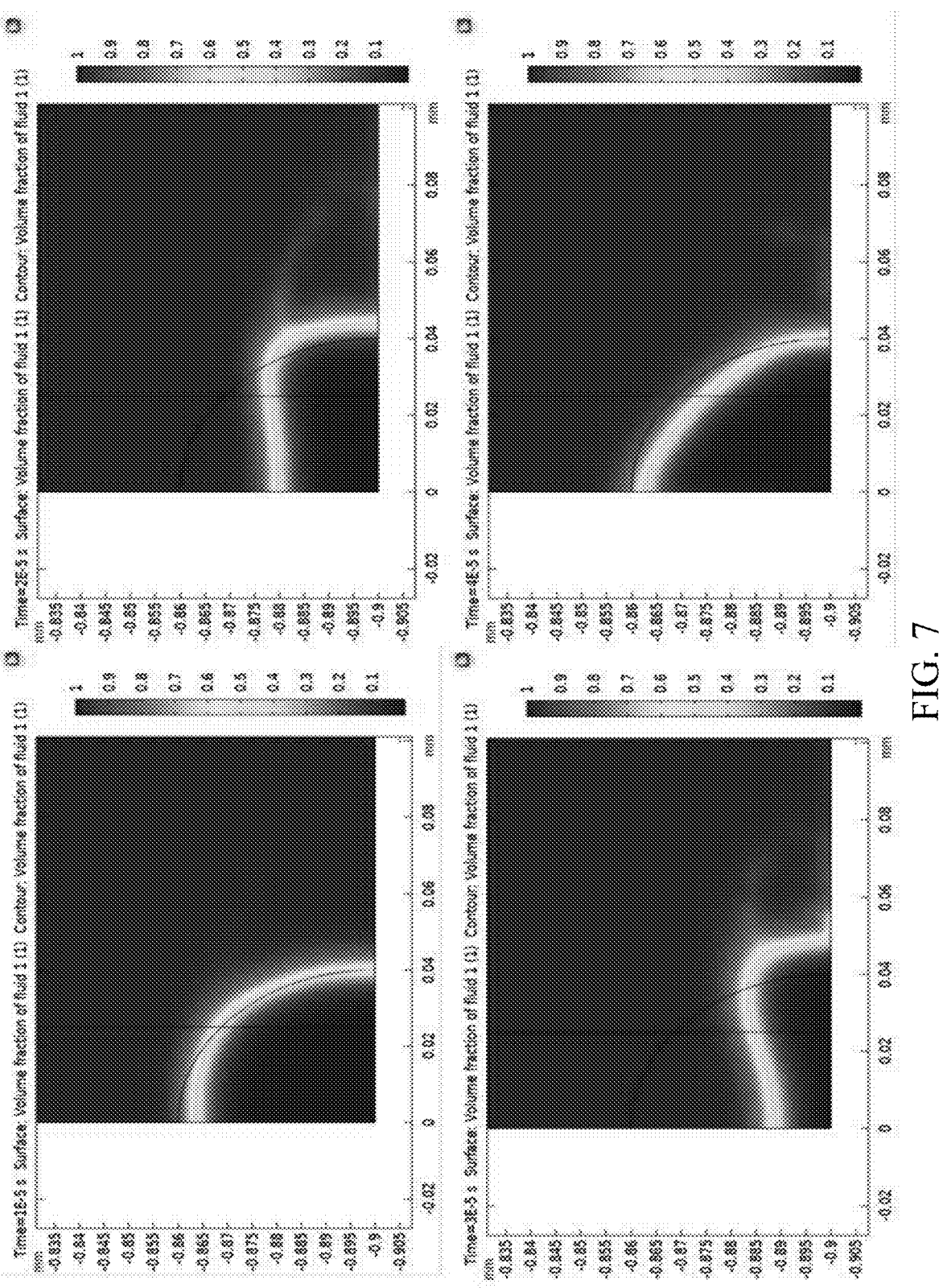
FIG. 7 shows the gas planarization with a contact angle of $\pi/2$ rad (90°), pulse speed of 5 m/s, drop radius=40 μm, pulse length of 20 μs.

It was observed that in the case of a large droplet (R=40 μm), when the contact angle is high (90°) the gas pulse only temporarily deforms the droplet and does not quite achieve full planarization (see, FIG. 7). Also, since the droplet is larger than the nozzle opening, there is more flattening in the middle than at the edges of the droplet. After the pulse, the droplet returns to its original shape.

Figure 8:
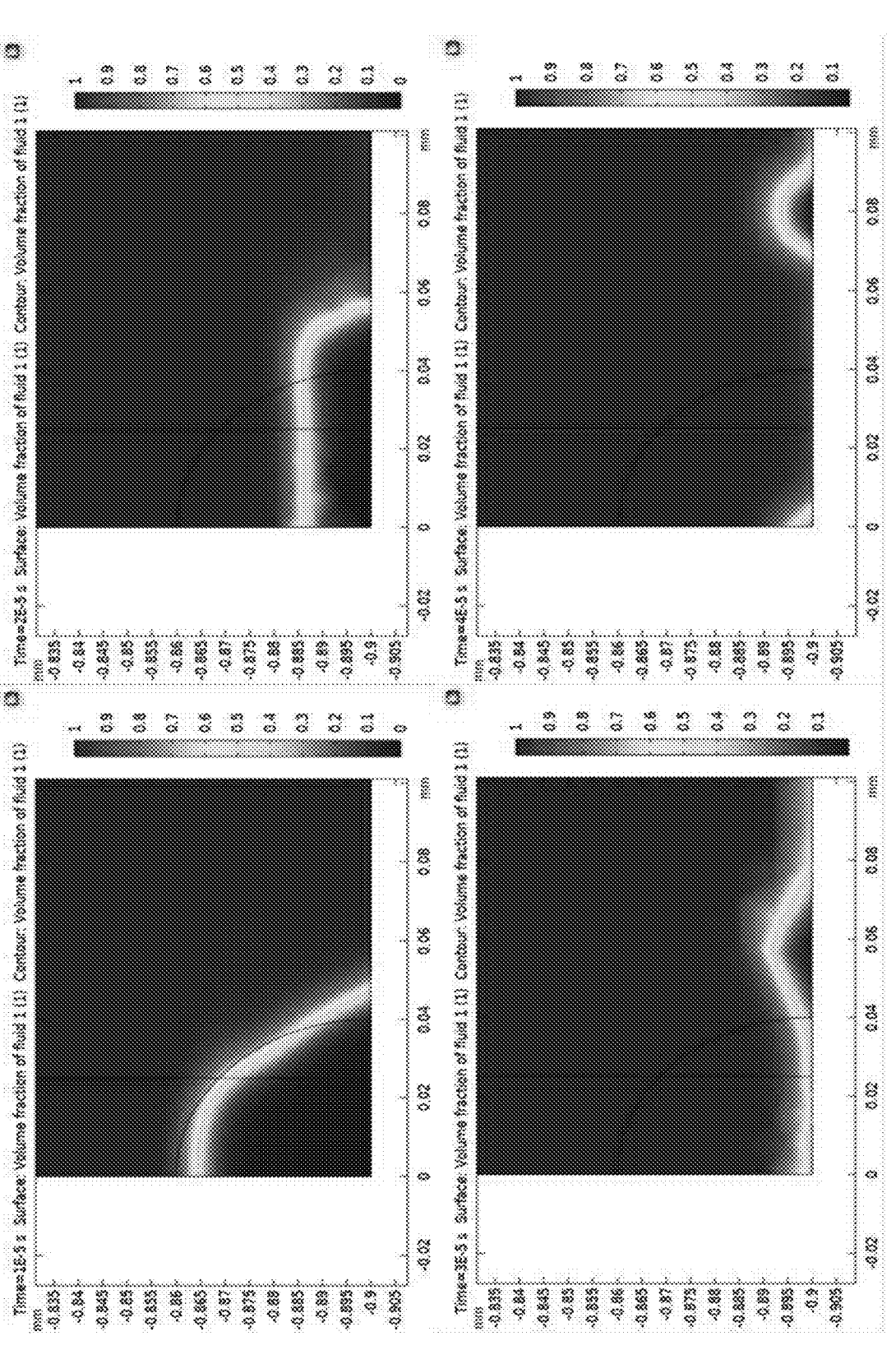
FIG. 8 shows the gas planarization with a contact angle of $\pi/3$ rad (60°), pulse speed of 5 m/s, drop radius=40 μm, pulse length of 20 μs.
Figure 9:
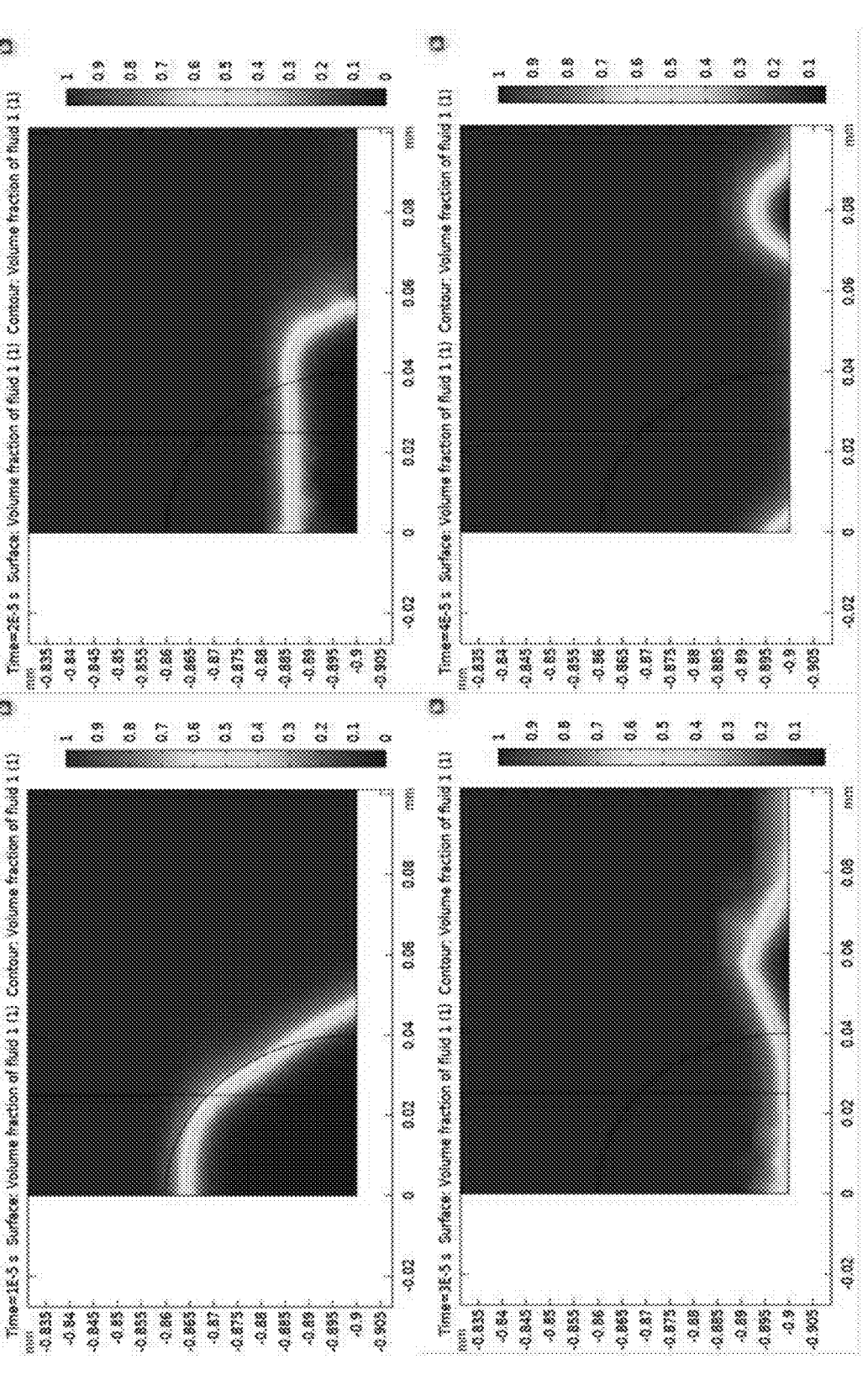
FIG. 9 shows the gas planarization with a contact angle of $\pi/4$ rad (45°), pulse speed of 5 m/s, drop radius=40 μm, pulse length of 20 μs.

In the case of a large droplet (R=40 μm) with smaller contact angles (60° and 45°), it appears that the gas pulse does achieve full planarization of the droplet, limited only by the resolution of the mesh used for the finite model simulation (see, FIG. 8 and FIG. 9). After the gas pulse, the bulk of the liquid has spread out, being thicker on the outer rim, while leaving a thin film of liquid behind at the center, with a thickness below 1 μm.

Figure 10:
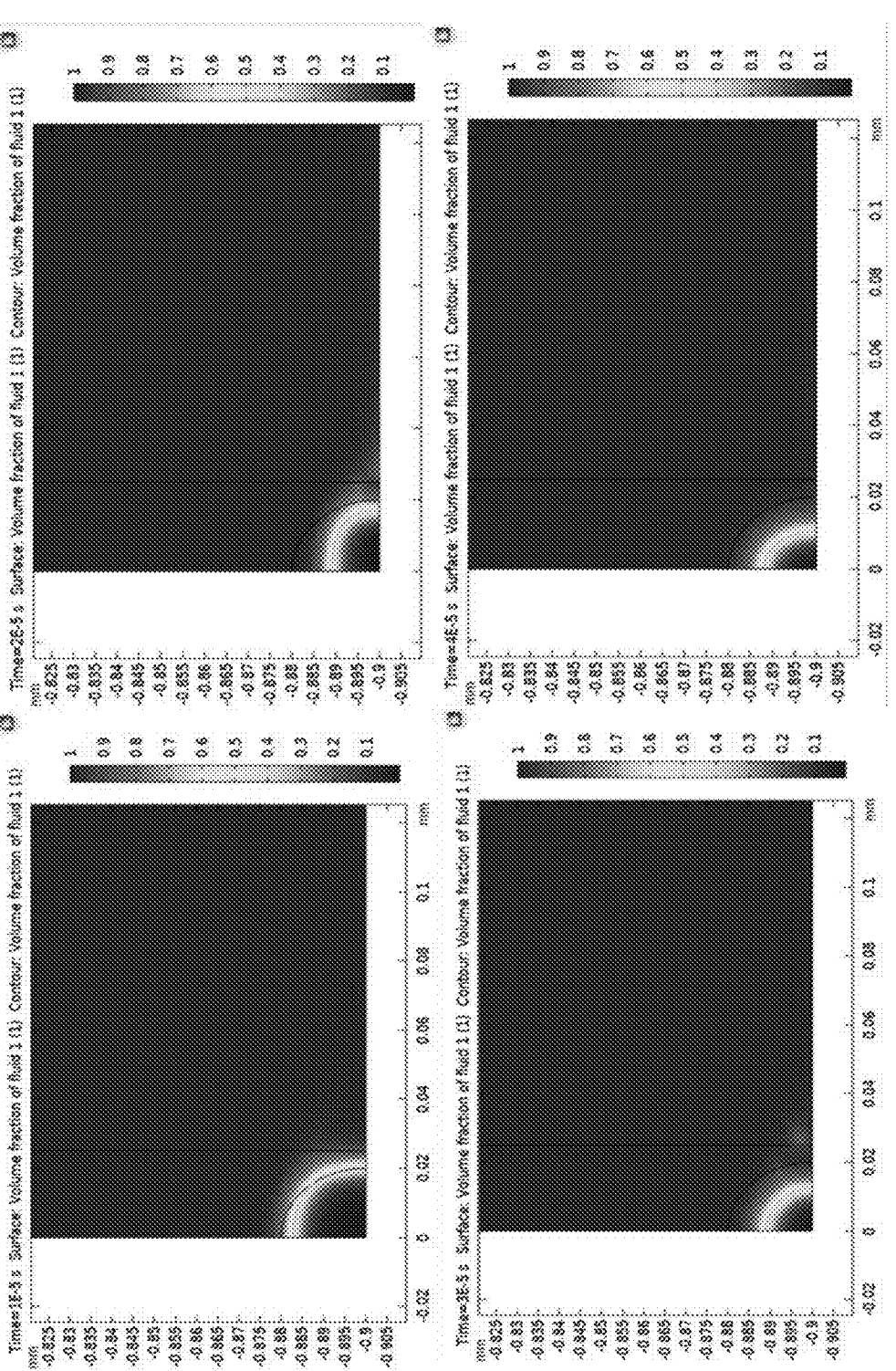
FIG. 10 shows the gas planarization with a contact angle of $\pi/2$ rad (90°), pulse speed of 5 m/s, drop radius=0.02 mm, pulse length of 20 μs.

In the case of the small droplet size (R=20 μm) with a large contact angle (90°), it appears that the gas pulse only strips layers from the droplet, decreasing its size, without spreading it on the substrate (see, FIG. 10).

Figure 11:
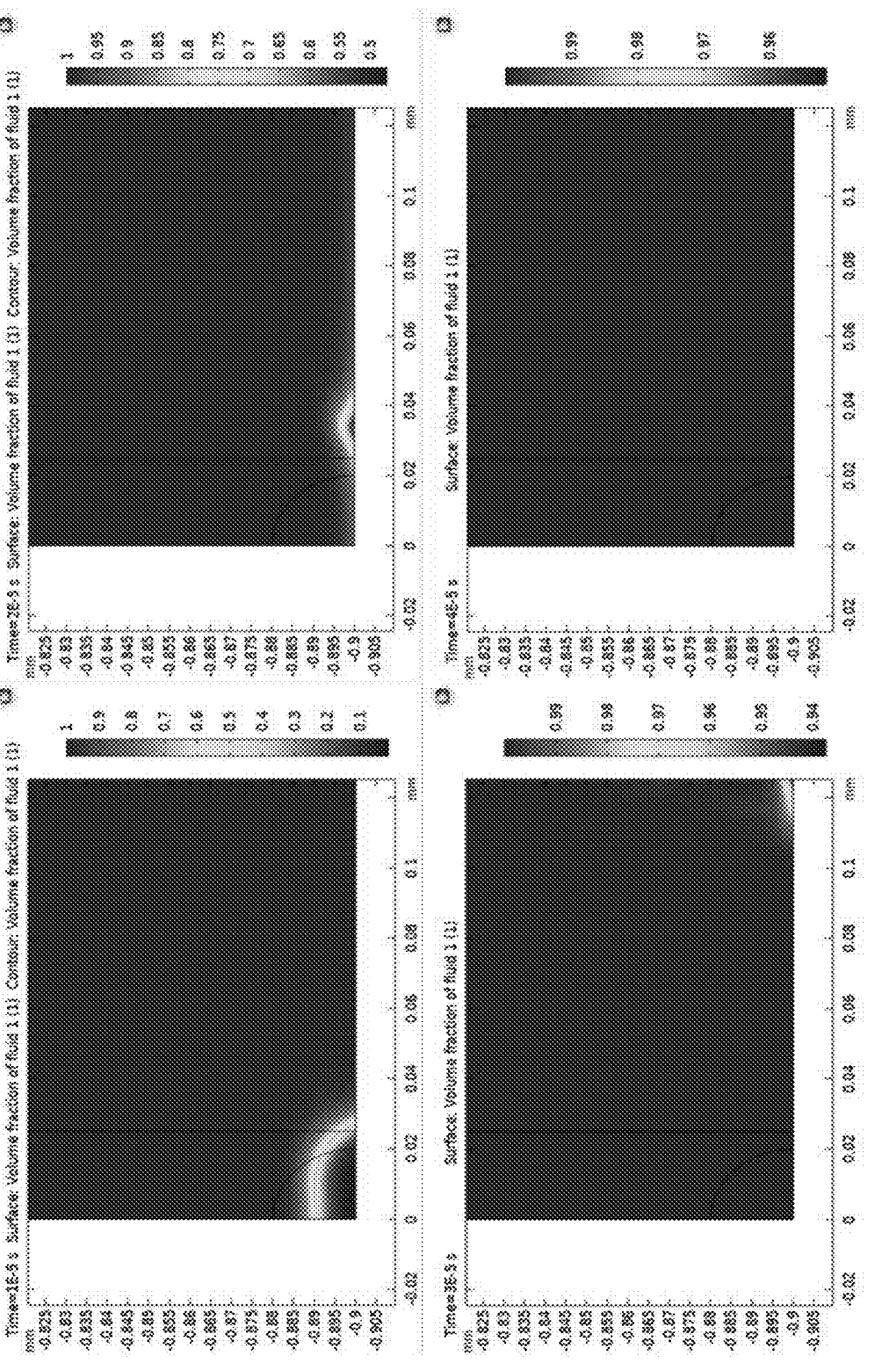
FIG. 11 shows the gas planarization with a contact angle of $\pi/3$ rad (60°), pulse speed of 5 m/s, drop radius=0.02 mm, pulse length of 20 μs.
Figure 12:
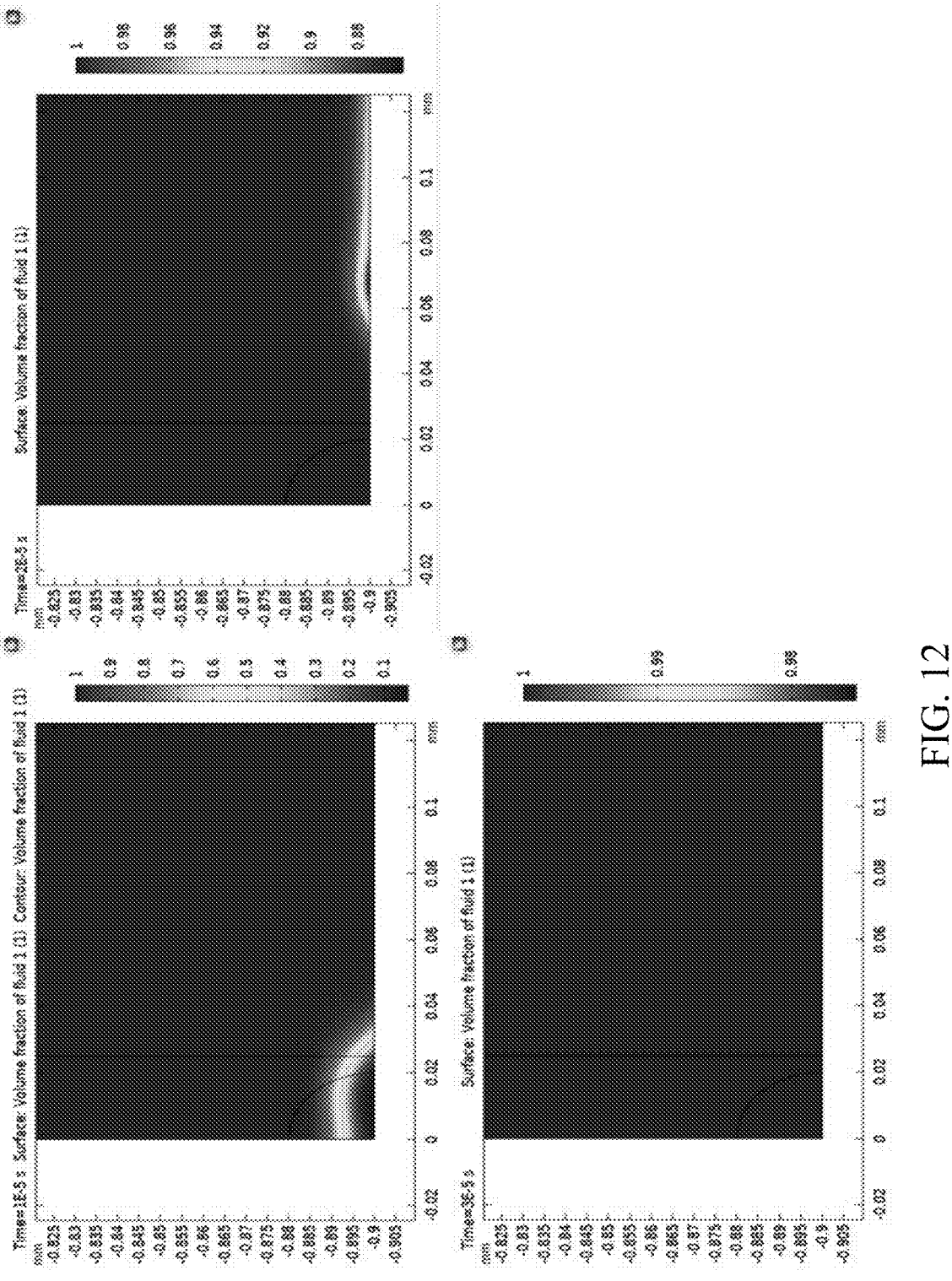
FIG. 12 shows the gas planarization with a contact angle of $\pi/4$ rad (45°), pulse speed of 5 m/s, drop radius=0.02 mm, pulse length of 20 μs.

In the case of a small droplet (R=20 μm) with smaller contact angles (60° and 45°), while the droplet is in fact spread out by the gas flow, the resulting thickness of the film at the center is so small that it can be interpreted as being absent (see, FIG. 11 and FIG. 12). Thus, there appears to be an adequate gas flow for each droplet size that avoids removing the liquid from the center of the substrate completely.

Experimental Demonstration of LPEBIP in Thin Liquid Layers

It has been previously possible to show LPEBIP deposition of Cu in flat liquid films. This was achieved by creating 3 μm deep wells and channels attached to deeper precursor reservoirs with deep reactive ion etching in silicon. The reservoirs were filled with liquid precursor ex-situ and were placed inside an ESEM with electron beam patterning capabilities. The precursor was 125 millimolar (mM), 63 mM and 31 mM $CuSO_4$ with 100 mM $H_2SO_4$ and Triton X-100. Thus, the reservoirs would be filled with liquid precursor and the liquid precursor would spread through capillary force to the adjacent channel and well. By carefully controlling the substrate temperature and water-vapor pressure in the chamber (3° C. and ~6 Torr) an equilibrium was reached where the liquid film was stable. The absence of signal variation in the ESEM was also observed, indicative of a flat liquid film. Using this test bed, copper was deposited selectively in the channel regions where the flat, thin liquid precursor film was, using the electron beam of the ESEM at 30 kilovolt and 700 picoampere. A main feature of the deposits was that they could only be as high as the liquid film itself.

Conclusions

The finite element simulation model solved the issue of achieving a flat and thin liquid precursor film by demonstrating the full planarization of a liquid precursor droplet for LPEBIP below 1 μm and possibly lower, limited only by the resolution of the mesh used to solve the model. The analysis revealed the criticality of the contact angle of the droplet on the substrate surface. The contact angle can be modulated using surfactants as well as UV/ozone and oxygen plasma treatment of surfaces. It would also be advantageous to adapt the gas flow speed to the liquid precursor droplet size to avoid over spreading it from the center of the work site, where the defect on the photomask is to be repaired. In addition, proof of concept work has already been done to enable LPEBIP deposition of Cu in flat, even, thin liquid films exposed to the vacuum conditions of the ESEM. These deposits may achieve a maximum thickness equal to that of the liquid precursor film. This means it is of paramount importance to have a method to control this thickness if precise repairs are to be done on thin films of photomasks measuring a few nanometers in height.

In a first example, there is provided a repair method including providing a scanning electron microscope (SEM) with an electron beam directed at a defective multilayer photomask disposed in the SEM; disposing a droplet of a liquid precursor on a surface of the defective multilayer photomask that is a site of a defect; pointing a gas flow on the droplet, wherein the gas flow is configured to planarize the droplet; and repairing the defect in the defective multilayer photomask by performing a chemical reaction on the planarized droplet.

In a second example, the repair method of the first example may further include carrying out the chemical reaction in an environmental SEM (ESEM).

In a third example, the repair method of the first or the second example may further include an electron beam, wherein the chemical reaction is an electron beam-induced electrochemical reaction including deposition of a reaction product from the liquid precursor at the defect.

In a fourth example, the liquid precursor of the third example may include a precursor selected from the group consisting of molybdenum, silicon, chromium, copper, platinum, gold, silver, or combinations thereof.

In a fifth example, the chemical reaction of the first or the second example may include partial removal of the defective multilayer photomask by etching.

In a sixth example, the liquid precursor of the fifth example may include a precursor selected from the group consisting of an acid, a base, or combinations thereof.

In a seventh example, disposing the droplet of the liquid precursor on the defective multilayer photomask of any of the previous examples may further include using a first liquid injection system.

In an eighth example, the repair method of any of the previous examples may further include removal of the liquid precursor after the chemical reaction.

In a ninth example, the removal of the eighth example may be effected by rinsing with a rinsing agent from a second liquid injection system.

In a tenth example, the removal of the eighth example may be effected by rinsing the surface of the defective multilayer photomask by spin coating.

In an eleventh example, the repair method of any of the previous examples may be carried out at a temperature ranging approximately between 1° C. and 15° C.

In a twelfth example, the repair method of any of the second to eleventh example may be carried out at a pressure ranging approximately between 400 Pascal and 800 Pascal.

In a thirteenth example, the repair method of the example 3 may further include assessing the reaction product obtained from the chemical reaction at the defect and performing a second deposition of the reaction product if the repair of the defect is incomplete.

In a fourteenth example, the planarized droplet of any of the previous examples may have a thickness of approximately 1 μm or below.

In a fifteenth example, there is provided a photomask repair system including a scanning electron microscope (SEM); a first liquid injection system positioned to deposit a droplet of a liquid precursor on a defective multilayer photomask; a gas injection system positioned to point a gas flow on the droplet, wherein the gas flow is configured to planarize the droplet; and an electron beam configured to perform an electron-beam-induced electrochemical reaction on the planarized droplet.

In a sixteenth example, the photomask repair system of example 15 may further include a vacuum chamber configured to operate at a pressure in the range of approximately 400 Pascal and 800 Pascal.

In a seventeenth example, there is provided a photomask repair tool including an environmental scanning electron microscope (ESEM) including a vacuum chamber and an electron beam; a first liquid injection system configured to deposit a droplet of a liquid precursor on a defect on an extreme ultraviolet (EUV) photomask; and a gas injection system configured to eject a gas flow on the EUV photomask within the vacuum chamber and positioned in a distance of approximately from 200 µm to 400 µm from the EUV photomask.

In an eighteenth example, the gas injection system of example 17 may include at least one gas nozzle.

In a nineteenth example, the gas injection system of example 17 or 18 may include two gas nozzles configured to eject two gas flows from two directions on the droplet.

In a twentieth example, the photomask repair tool of any of the previous examples 17 to 19 may further include a second liquid ejection system configured to rinse the liquid precursor from the EUV photomask.

The properties of the tool, system and the method presented above are intended to be exemplary for the photomasks. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" or "approximately" in relation to a given numerical value, such as for amplitude, duration, frequency, thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. A repair method comprising:
    providing a scanning electron microscope (SEM) with an electron beam directed at a defective multilayer photomask disposed in the SEM;
    disposing a droplet of a liquid precursor on a surface of the defective multilayer photomask that is a site of a defect;
    applying a gas flow pulse on the droplet, wherein the gas flow pulse is configured to planarize the droplet, and wherein the gas flow pulse comprises a moisturized gas configured to avoid evaporation of the liquid precursor; and
    repairing the defect in the defective multilayer photomask by performing a chemical reaction on the planarized droplet.

2. The repair method of claim 1, further comprising carrying out the chemical reaction in an environmental SEM (ESEM).

3. The repair method of claim 1, further comprising an electron beam, wherein the chemical reaction is an electron beam-induced electrochemical reaction comprising deposition of a reaction product from the liquid precursor at the defect.

4. The repair method of claim 3, wherein the liquid precursor comprises a precursor selected from the group consisting of molybdenum, silicon, chromium, copper, platinum, gold, silver, or combinations thereof.

5. The repair method of claim 1, wherein the chemical reaction comprises partial removal of the defective multilayer photomask by etching.

6. The repair method of claim 5, wherein the liquid precursor comprises a precursor selected from the group consisting of an acid, a base, or combinations thereof.

7. The repair method of claim 1, wherein disposing the droplet of the liquid precursor on the defective multilayer photomask comprises using a first liquid injection system.

8. The repair method of claim 1, further comprising removal of the liquid precursor after the chemical reaction.

9. The repair method of claim 8, wherein the removal is effected by rinsing with a rinsing agent from a second liquid injection system.

10. The repair method of claim 8, wherein the removal is effected by rinsing the surface of the defective multilayer photomask by spin coating.

11. The repair method of claim 1, wherein the repair method is carried out at a temperature ranging approximately between 1° C. and 15° C.

12. The repair method of claim 2, wherein the method is carried out at a pressure ranging approximately between 400 Pascal and 800 Pascal.

13. The repair method of claim 3, further comprising assessing the reaction product obtained from the chemical reaction at the defect and performing a second deposition of the reaction product if the repair of the defect is incomplete.

14. The repair method of claim 1, wherein the planarized droplet has a thickness of approximately 1 µm or below.

15. A photomask repair system comprising:
    a scanning electron microscope (SEM);
    a first liquid injection system positioned to deposit a droplet of a liquid precursor on a defective multilayer photomask;
    a gas injection system positioned to apply a gas flow pulse on the droplet, wherein the gas flow pulse is configured to planarize the droplet, and wherein the gas injection system comprises a vapor pressure injection structure configured to introduce moisture to the gas flow pulse to avoid evaporation of the liquid precursor; and
    an electron beam configured to perform an electron-beam-induced electrochemical reaction on the planarized droplet.

16. The photomask repair system of claim 15, wherein the photomask repair system further comprises a vacuum chamber configured to operate at a pressure in a range of approximately 400 Pascal and 800 Pascal.

17. A photomask repair tool comprising:
    an environmental scanning electron microscope (ESEM) comprising:
        a vacuum chamber and an electron beam;
        a first liquid injection system configured to deposit a droplet of a liquid precursor on a defect on an extreme ultraviolet (EUV) photomask; and a gas injection system configured to apply a gas flow pulse on the EUV photomask within the vacuum chamber and positioned in a distance of approximately from 200 μm to 400 μm from the EUV photomask, wherein the gas injection system comprises a vapor pressure injection structure configured to introduce moisture to the gas flow pulse to avoid evaporation of the liquid precursor.

18. The photomask repair tool of claim 17, wherein the gas injection system comprises at least one gas nozzle.

19. The photomask repair tool of claim 18, wherein the gas injection system comprises two gas nozzles configured to eject two gas flows from two directions on the droplet.

20. The photomask repair tool of claim 17, further comprising a second liquid ejection system configured to rinse the liquid precursor from the EUV photomask.

\* \* \* \* \*